United States Patent
Deboy

(10) Patent No.: US 9,577,629 B2
(45) Date of Patent: Feb. 21, 2017

(54) CIRCUIT FOR AN ACTIVE DIODE AND METHOD FOR OPERATING AN ACTIVE DIODE

(75) Inventor: Gerald Deboy, Klagenfurt (AT)

(73) Assignee: Infineon Technologies Austria AG, Villach (AT)

( * ) Notice: Subject to any disclaimer, the term of this patent is extended or adjusted under 35 U.S.C. 154(b) by 739 days.

(21) Appl. No.: 12/239,482

(22) Filed: Sep. 26, 2008

(65) Prior Publication Data

US 2009/0140707 A1    Jun. 4, 2009

(30) Foreign Application Priority Data

Sep. 28, 2007   (DE) .................. 10 2007 046 705

(51) Int. Cl.
   *H03K 17/16*    (2006.01)
   *H03K 17/30*    (2006.01)

(52) U.S. Cl.
   CPC ......... *H03K 17/166* (2013.01); *H03K 17/302* (2013.01)

(58) Field of Classification Search
   CPC .................. H03K 17/166; H03K 17/302
   USPC ....... 327/427, 434, 493, 538, 380, 381, 387, 327/389, 404
   See application file for complete search history.

(56) References Cited

U.S. PATENT DOCUMENTS

| | | | |
|---|---|---|---|
| 5,646,520 A | 7/1997 | Frank et al. | |
| 5,726,505 A | 3/1998 | Yamada et al. | |
| 5,747,975 A * | 5/1998 | Colandrea et al. | 323/276 |
| 5,936,440 A * | 8/1999 | Asada et al. | 327/110 |
| 6,181,186 B1 * | 1/2001 | Itoh et al. | 327/309 |
| 6,891,425 B1 | 5/2005 | Huynh | |
| 7,138,778 B2 * | 11/2006 | Fujino et al. | 318/433 |
| 2005/0218963 A1 * | 10/2005 | Ball et al. | 327/427 |
| 2008/0048746 A1 * | 2/2008 | Raman | 327/205 |

FOREIGN PATENT DOCUMENTS

| | | |
|---|---|---|
| DE | 100 01 485 A1 | 7/2001 |
| DE | 103 45 929 A1 | 4/2005 |
| DE | 10 2005 033 477 A1 | 1/2007 |
| GB | 2 441 934 A | 3/2008 |

* cited by examiner

*Primary Examiner* — Lincoln Donovan
*Assistant Examiner* — Colleen O Toole
(74) *Attorney, Agent, or Firm* — Slater Matsil, LLP

(57) ABSTRACT

Embodiments of the invention relate to a circuit for an active diode, a method for operating an active diode, and, based thereon, an integrated active diode system, a rectifier, and a system for voltage conversion and/or regulation, comprising at least one transistor by which a current defined as positive from a first connection to a second connection of the transistor can be controlled, and at least one measuring/control circuit (for determining the current by means of which the at least one transistor can be switched on for currents under and at most up to a predetermined, non-positive threshold value ($i1 \leq i_{th} \leq 0$), and can otherwise be switched off.

31 Claims, 3 Drawing Sheets

CIRCUIT FOR AN ACTIVE DIODE AND METHOD FOR OPERATING AN ACTIVE DIODE

This application claims priority to German Patent Application 10 2007 046 705.4, which was filed Sep. 28, 2007 and is incorporated herein by reference.

TECHNICAL FIELD

The invention relates to a circuit for an active diode, a method for operating an active diode, and, based thereon, an integrated active diode system, a rectifier, and a system for voltage conversion and/or regulation.

BACKGROUND

Diodes have long since been used for supplying electric and especially electronic devices with electric energy.

In the applications mentioned, diodes can be used for controlling the energy flow to the consumers mentioned. Diodes, on the one hand, permit a current flow in their flow direction, i.e., from their anode to their cathode, in a preferably unhindered manner, namely with a loss of power, i.e., a voltage drop across the diode which is as small as possible. On the other hand, the diodes also minimize the current flow in the reverse direction, i.e., from their cathode to their anode.

SUMMARY

One field of application of diodes is thus also the rectification of currents, e.g., by synchronous rectifying devices, as it is, for instance, necessary on the secondary or output side of isolated or non-isolated transmitters or voltage converters. Examples of such kinds of voltage converters are flyback converters, single-ended forward converters, two-transistor forward converters, half-bridge converters, phase-shift zero-voltage-switched (ZVS) full-bridge converters, etc.

Furthermore, diodes are used in AC/DC and in DC/DC conversion, for instance, in the typical conversion of 400 V direct voltage in an isolated manner to 12 V to 48 V direct voltage. Combinations and modifications of the above-mentioned converter topologies are used in the field of voltage regulator modules and in the field of DC/DC conversion which has already been mentioned, e.g., in the typical voltage conversions of 48 V in an isolated manner to 12 V, 5 V, or 3 V at the output side. However, there exist also non-isolated topologies with a subsequent rectification such as, for instance, the topology of the phase-shift ZVS full-bridge converter.

It is noted that the above-mentioned applications are to be understood merely as examples and by no means as restrictions for the embodiments described in the following. The person skilled in the art will understand by means of the description that the subject matters of the invention may be used with any applications in which especially diodes that are insensitive to disturbances and/or quick active diodes are required or are of advantage.

To comply with the above-mentioned requirements, in particular, the small conversion losses, diodes with a metal semiconductor transition, i.e., Schottky diodes, have often been used, which are characterized by low forward voltages.

In many voltage converter applications, however, low output voltages are used. Thus, the lower the output voltage, the higher correspondingly pertinent output currents have to be processed for a solid power to be transmitted.

Higher output currents in turn have the consequence that the conducting losses of rectifier diodes with a voltage drop of typically 500 mV to 700 mV for low-voltage Schottky diodes carry more weight and excessively impair the efficiency of the power transmission.

Correspondingly, the forward voltages of Schottky diodes as mentioned in the range of several hundred millivolts have proved still to be too high for many applications. Likewise, the leaking reverse currents of the Schottky diodes are often unacceptably high, in particular, for high reverse voltages.

For a further reduction of the diode forward voltage, instead of passive diodes with two connections, active circuit elements such as, for instance, transistors with three connections have been used as active diodes for a lengthy time.

An n-channel MOSFET transistor may, for instance, be used as such an active diode with the source connection as an anode and the drain connection as a cathode. By the switching-on of the channel of the MOSFET transistor via the gate connection, the forward voltage of the MOSFET transistor as an active diode may, also in operation in the third quadrant, i.e., with a negative drain-source-voltage ($u_{DS}<0$) and a negative drain-source-current ($i_{DS}<0$) in which the channel and the body diodes are positioned parallel to one another, be placed to arbitrarily low values. Limiting with respect to the conducting losses of the MOSFET transistor as an active diode are merely its capacities, size, and costs.

The use of active diodes, however, necessitates a suitable controlling of their control connection.

Referring to the example with a MOSFET transistor as an active diode, circuits are known which cause, with the existence of, e.g., negative voltages between drain (cathode) and source (anode), i.e., positive diode voltages between anode and cathode, a switching-on of the gate connection of the MOSFET transistor. Such circuits are conceived, in particular, for the use in active rectifiers.

A common characteristic feature of known active diodes is, however, that they either have to be controlled by external voltage signals, and/or require a considerable circuit complexity to control the control connection of the active diode in a suitable manner.

Circuits which measure and evaluate the voltage signal across the active diode require a safe detection of the zero crossing with detectable active voltage levels of approximately −1 V, but interference voltage levels of several 10 V to approximately 100 V. A regulation for the control connection of the active diode which is based on the evaluation of the voltage across the active diode is therefore sensitive to disturbance, and correspondingly the voltage signal to be evaluated has to be cleaned by means of expensive filtering.

This filtering or the increased circuit complexity, respectively, render the reaction of the active diode to changes from external signals, in particular, to the switching on and off of the body diode, extremely slow.

In one aspect the invention provides a novel circuit for an active diode and a novel method for operating an active diode.

A circuit for an active diode, a method for operating an active diode, and, based thereon, an integrated active diode system, a rectifier, and a system for voltage conversion and/or regulation are provided such as they are described and/or illustrated substantially in combination with at least one of the figures.

Advantageous further developments of the invention are indicated in the subclaims.

BRIEF DESCRIPTION OF THE DRAWINGS

In the following, aspects of embodiments of the invention will be explained in more detail by means of the enclosed drawings. The drawings show.

DETAILED DESCRIPTION OF ILLUSTRATIVE EMBODIMENTS

Figure 1:
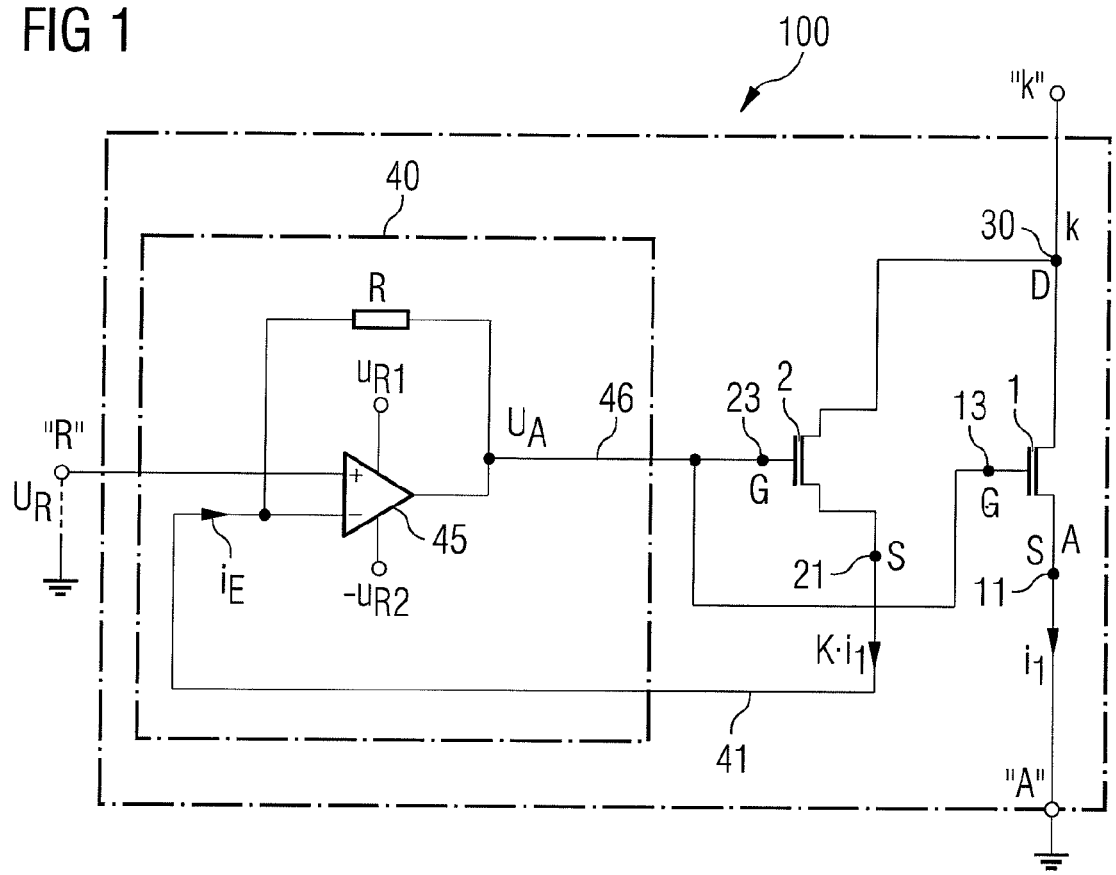
FIG. 1 shows a schematic representation of a circuit for an active diode in accordance with an embodiment.

FIG. 1 shows a schematic representation of a circuit 100 for an active diode in accordance with an embodiment. The circuit 100 for an active diode comprises an n-channel MOSFET transistor 1 as a main transistor (illustrated at the right in FIG. 1). With this transistor 1, a current $i_1$ defined as positive from a first upper connection k in FIG. 1 to a second lower connection A in FIG. 1 can be controlled, which corresponds to the negative current through the active diode.

As an active diode in the form of the transistor 1, field effect transistors, in particular planar MOSFET transistors, trench MOSFET transistors, field-plate trench MOSFET transistors, superjunction transistors, p-channel MOSFET transistors, and the like MOSFET transistor concepts, and bipolar transistors and Insulated Gate Bipolar Transistors (IGBTs) may be used in general with an appropriate adaptation of the circuit 100.

Furthermore, the circuit comprises, in the left portion of FIG. 1, a measuring/control circuit 40 for determining the current $i_1$ through the transistor 1. By means of this measuring/control circuit 40, the transistor 1 mentioned can be switched on for currents $i_1$ under and at most up to a predetermined, non-positive threshold value ($i_1 \leq i_{th} \leq 0$), and otherwise be switched off.

Thus, this embodiment of the invention makes use of a current signal, in the example of a current signal derived from the current $i_1 = -i_{Ak}$, instead of a voltage signal such as, for instance, $u_{Ak}$, and of a simple wiring of the active diode for evaluation.

Particular embodiments may be configured such that the channel of the MOSFET transistor starts the switch-off process of the active diode already once an adjustable, non-positive threshold value ith of the current $i_1$ which is negative in the active operation is exceeded. Thus, it is possible to practically prevent a short circuit in the circuit 100 due to a late switching-off of the active diode.

The transistor 1 as an active diode with three connections permits, as already mentioned, a reduction of the conducting losses vis-à-vis passive diodes with two connections. Typically, a reduction of the conducting losses by 50% is aimed for vis-à-vis a solution with a passive diode.

Instead of collecting voltage signals, for instance, between the first connection k and the second connection A of the transistor 1 with an active voltage level of 1 V and interference levels of typically 50 V to 100 V, the circuit 100 in the embodiment of FIG. 1 evaluates a current signal derived from the current $i_1$ through the transistor 1 from the first connection k to the second connection A so as to generate a signal for controlling the active diode.

This control by means of the circuit 100 of FIG. 1 may be characterized by at least two states of the active diode which can, as a rule, be collected with higher interference resistance, and by corresponding modes of the measuring/control circuit 40.

A first state of the active diode is characterized by a negative current $i_1$ which maximally reaches the non-positive threshold value $i_1 \leq i_{th} \leq 0$ through the transistor 1, i.e., a non-negative current $i_{Ak} \geq -i_{th}$ through the active diode, namely from the second connection A of the transistor 1, which corresponds to the anode of the active diode, to the first connection k of the transistor 1, which corresponds to the cathode of the active diode. If the first state is collected, the active diode is in the forward state and the MOSFET transistor 1 may be switched on by a first mode of the measuring/control circuit 40.

On the contrary, a second state of the active diode is characterized by a, possibly just starting, positive current $i_1>0$ through the transistor 1, i.e., a negative current $i_{Ak}<0$ through the active diode. If the second state is collected, the active diode is in the reverse state and the MOSFET transistor 1 may be switched off by a second mode of the measuring/control circuit 40.

For collecting the current $i_1$ through the transistor 1 as a first transistor, the circuit, as in the embodiment of FIG. 1, may, for instance, comprise a second n-channel MOSFET transistor 2 as a mirror transistor for mirroring the first current $i_1$ in a second current $K \cdot i_1$. The mirror ratio K may basically be chosen as required. In the case of a first transistor 1 and a second transistor 2 which are integrated in a joint semiconductor, the mirror ratio may, for instance, be chosen as K=1, and the structure of the second transistor 2 may be chosen equal to that of the first transistor 1 so as to counteract faulty collections of the first current $i_1$ due to process fluctuations.

It is noted that, for collecting the current $i_1$ through the transistor 1, instead of the second transistor 2, other devices or circuits are also suited which stress or impair the first transistor 1 and its switching behavior as an active diode as little as possible.

In the embodiment of FIG. 1, the measuring/control circuit 40 is arranged on the voltage signal line 41 for measuring the second current $K \cdot i_1$ and for generating a pertinent control signal. The gate terminals 13, 23 may, as control connections of the at least one first transistor 1 and second transistor 2, jointly be controllable by the control signal by the measuring/control circuit 40 on the voltage signal line 41 such that the first transistor 1 and the second transistor 2 can be switched on for first currents $i_1$ under and at most up to a predetermined, non-positive threshold value ($i_1 \leq i_{th} \leq 0$), and otherwise be switched off.

It is noted that, instead of one single first transistor 1 and one single second transistor 2, a plurality of first and second transistors that are switched in parallel may be used.

In particular embodiments, a current signal corresponding to the first current $i_1$ in the form of the second current $K \cdot i_1$, which is defined as positive from the joint drain connection 30 of the first transistor 1 and second transistor 2 to the source connection 21 of the second transistor 2, is measured and evaluated by means of the integrated measuring/control circuit 40.

A chip-on-chip device may, for instance, be used as measuring/control circuit 40. Alternatively, the measuring/control circuit 40 may be integrated jointly with the first transistor 1 and the second transistor 2.

In a simple embodiment, the measuring/control circuit 40 comprises an operational amplifier 45 as a current voltage converter which may be integrated monolithically along with the first transistor 1 and second transistor 2. In the embodiment of FIG. 1, the second current $K \cdot i_1$ as an input current $i_E$ is converted to the output voltage $u_A$ on the output line 46 of the operational amplifier 45.

The operational amplifier 45 may be equipped and wired such that, in the above-mentioned first state of the active diode (forward state), with a negative current $i_1$ through the first transistor 1, i.e., $i_1 = i_{DS} < 0$ with $K > 0$, and a correspondingly negative input current $i_E$ in the measuring/control circuit 40 $i_E = K \cdot i_1 < 0$, due to the corresponding positive output voltage $u_A$ on the output line 46 of the inverting current voltage converter in the form of the operational amplifier 45 with $u_A = -i_E \cdot R = -K \cdot i_1 \cdot R > 0$, this positive output voltage $u_A$ as a control signal switches to the gate connections 13 and 23 of the first transistor 1 or the second MOSFET transistor 2.

Figure 4:
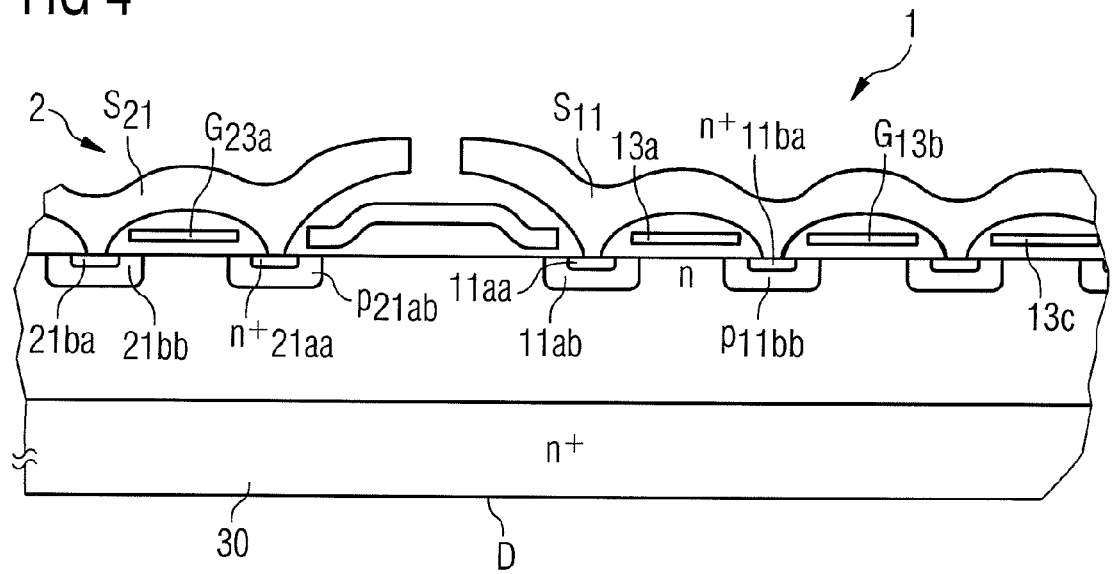
FIG. 4 shows a schematic cross-sectional representation of the layer structure of a main transistor (first transistor) and of a mirror transistor (second transistor) in the form of planar MOSFET transistors for an active diode in accordance with an embodiment.

Such a positive gate source voltage $u_{GS} > 0$ results with n-channel MOSFET transistors as a first transistor 1 and second transistor 2 to a conductive n-channel between the n+-doped regions of the source connections 11 and 21 which are arranged in p-doped wells, and a joint, n+-doped drain connection 30 of the first transistor 1 and second transistor 2 (cf. FIG. 4). This conductive n-channel enables a reverse current $i_1 = i_{DS} < 0$ through the first transistor 1, i.e., a forward current through the active diode $i_{Ak} = -i_1 > 0$ practically without entailing a diode forward voltage.

It is noted that the drain connection of the first transistor 1 and second transistor 2 need not be designed jointly, e.g., in the form of a joint semiconductor layer, but that any other conductive connection between the drain connections of the first transistor 1 and second transistor 2 is also suited.

It is further noted that the dopings mentioned refer to n-channel-like MOSFET transistor structures for the first transistor 1. As already mentioned, the basic idea of the invention can, however, basically be implemented with any transistor structures and with correspondingly arbitrary layer structures and doping profiles.

Further referring to FIG. 1, the operational amplifier 45 may be equipped and wired such that, in the above-mentioned second state of the active diode (reverse state), with a negligible input current $i_E$ in the measuring/control circuit 40 $i_E = K \cdot i_1 = 0$, or already once this input current $i_E$ reaches a non-positive threshold value $i_{th}/K$, i.e., in general before a forward current $i_1 = i_{DS} > 0$ through the first transistor 1 occurs, the output line 46 of the operational amplifier 45 directly, or downstream inverter stages 47a, 47b (shown in FIG. 2) switch the gate connection 13 of the first transistor 1 to ground.

Consequently, the first transistor 1 and the second transistor 2 are driven to the blocking zone, so that a forward current $i_1 = i_{DS} > 0$ through the first transistor 1, i.e., a reverse current through the active diode $i_{Ak} = -i_1 < 0$ is counteracted. This applies on principle irrespective of the intensity of a negative voltage $u_{Ak} < 0$ across the active diode, i.e., a positive voltage $u_{DS} > 0$ across the first transistor 1.

In the circuit 100 illustrated in FIG. 1, the current signal in the form of the second current $K \cdot i_1$ of the second transistor 2 is transmitted as input current $i_E$ to the measuring/control circuit 40 via the current signal line 41. The measuring/control circuit 40 comprises an operational amplifier 45 which is formed by a differential amplifier referenced to an external reference voltage $u_R$, in the example of FIG. 1, mass potential.

Figure 2:
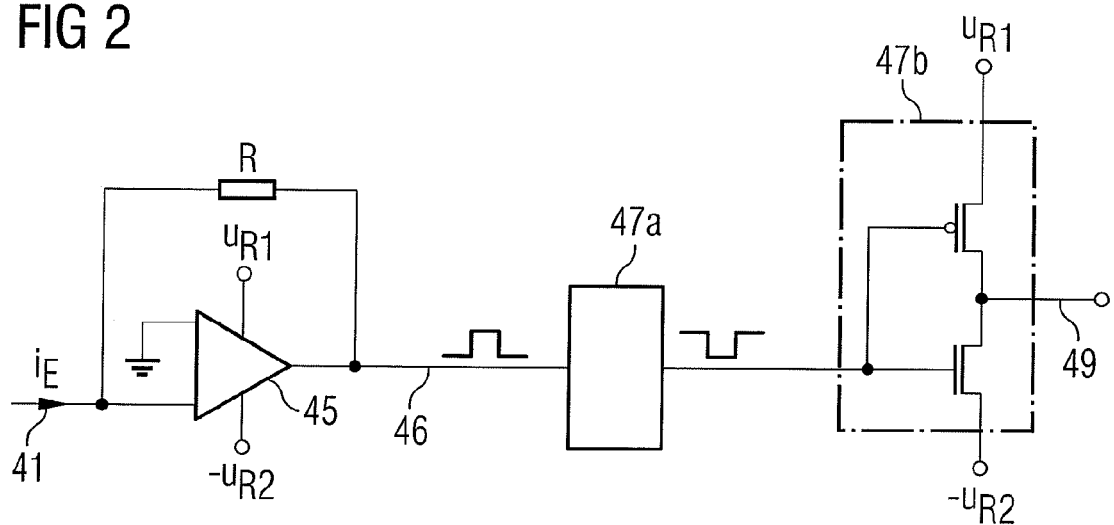
FIG. 2 shows a schematic representation of a circuit, and, in particular, of the structure of the driver stage for an active diode in accordance with an embodiment.

An optional driver stage downstream the operational amplifier 45 for controlling the first transistor 1 and second transistor 2 may, as illustrated in FIG. 2, be formed by a first inverter stage 47a and a downstream conventional driving CMOS inverter stage 47b which comprises a pair of a p-channel and an n-channel MOSFET transistor.

In the case of so-called resonant commutation of the current direction by the active diode, i.e., in the case of low values of $di_{Ak}/dt$, or, for instance, in the case of the use of the active diode in voltage converter topologies with a distinct dead time, the current direction through the active diode changes slowly from a negative current flow to a positive current flow.

In error cases or in primary-side hard-switching voltage converter topologies, however, a conductive active diode that is poled in the flow direction may be transferred from the above-mentioned first state (forward state) by a very quick voltage change in the reverse direction, i.e., in the direction of positive drain source voltages $u_{DS} > 0$, to a third state.

To avoid that, in this third state of the active diode, a short circuit current with a high power loss in the active diode occurs, the active diode has to be switched off particularly quickly in this case.

This may also be performed via the gate connection 13 of the first MOSFET transistor 1 in that it is also switched to ground by the measuring/control circuit 40, so that the first transistor 1 is driven to the blocking zone.

Thus, a positive current $i_1 > 0$ through the first transistor 1, i.e., a reverse current through the active diode $i_{Ak} < 0$, may substantially be inhibited on principle irrespective of the intensity of the positive voltage $u_{DS} > 0$ across the first transistor 1.

Figure 3A:
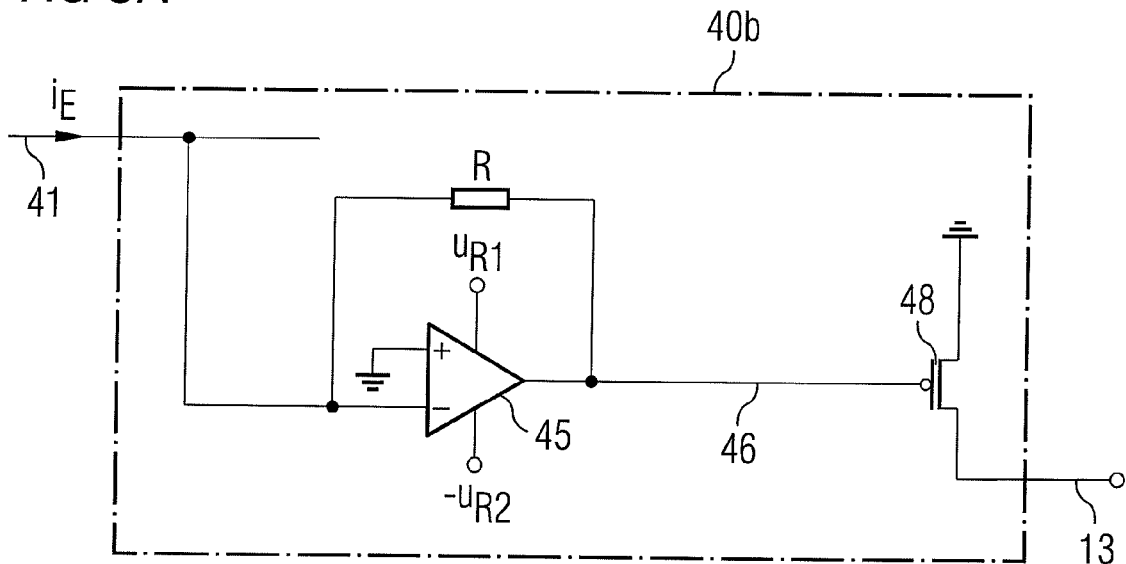
FIG. 3a shows a schematic representation of an additional measuring/control circuit stage for an active diode, in particular for evaluating leakage reverse currents ($i_1>0$), in accordance with an embodiment.

Therefore, in particular embodiments, the measuring/control circuit 40 may comprise a third mode in which the gate connection 13 of the first MOSFET transistor 1, as illustrated in FIG. 3a, may be switched off particularly quickly through an especially driver-compatible p-channel MOSFET transistor 48 with, for instance, a higher ampacity or a particularly low gate resistance.

For this purpose, the circuit 100 may comprise another parallel measuring/control circuit stage 40b for the measuring/control circuit 40, which is, for instance, configured as in FIG. 3a, which is capable, in the case of a positive first current $i_1$, to amplify or convert a correspondingly positive second (measurement) current $K \cdot i_1$ through the second transistor 2 and thus a positive input current $i_E$ in the measuring/control circuit 40. Pursuant to $u_A = -i_E \cdot R = -K \cdot i_1 \cdot R < 0$, a positive first current $i_1$ causes a negative output voltage $u_A$ of the operational amplifier 45. This negative output voltage $u_A$ can switch the p-channel MOSFET driver transistor 48 on. This in turn switches the gate connection 13 of the first transistor 1 hard to ground, so that the first transistor 1 is driven to the blocking zone, and a positive first current $i_1$ is thus counteracted.

To this end, the operational amplifier 45 in the form of a differential amplifier may again be referenced to mass potential at its positive signal input "+". Alternatively, for instance, in the circuit for controlling the active diode, a negative reference voltage $u_R$ may be generated for controlling the positive signal input "+" of the operational amplifier 45, wherein the circuit for controlling the active diode may, as already mentioned, also be designed as a separate controlling chip. In this case, too, a differential amplifier may be used as operational amplifier 45, which is adapted to amplify positive and negative input voltage differences in an output voltage range that can be chosen as suitable by the operating voltages $u_{R1}$ and $-u_{R2}$ with respect to the downstream stages.

Thus, the circuit concept presented allows, with a relatively simple additional wiring, for instance, in the form of a parallel measuring/control stage 40b for the measuring/control circuit 40, in which this additional wiring, once a high positive first current $i_1$ through the first transistor 1 is detected, may cause an "emergency off" of the first MOSFET transistor 1.

Figure 3B:
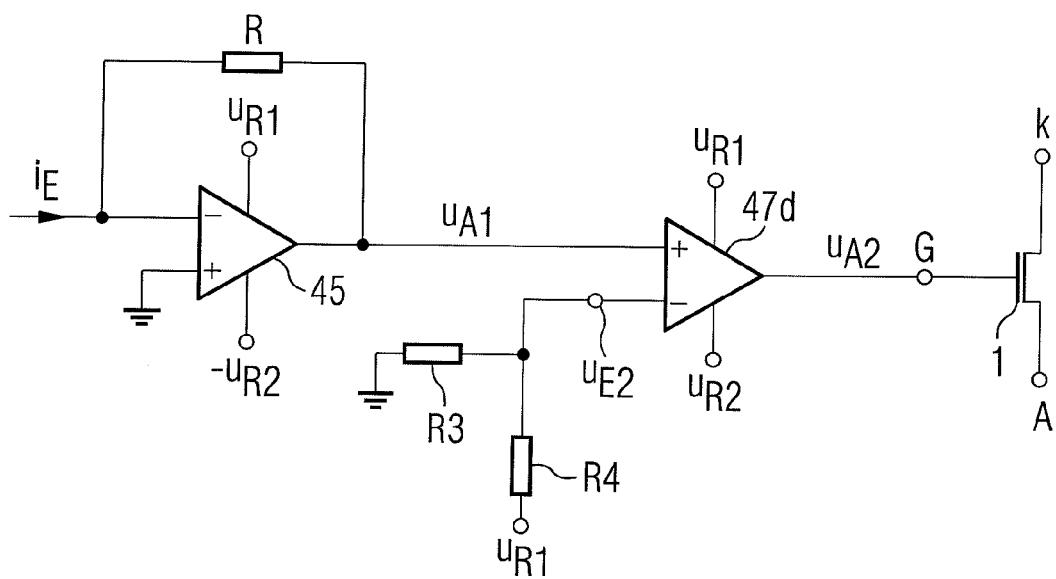
FIG. 3b shows a schematic representation of a measuring/control circuit stage for an active diode with a comparator for threshold adjustment in accordance with an embodiment.

FIG. 3b illustrates in a further embodiment a measuring/control circuit 40 with a comparator 47d for threshold adjustment. By this comparator 47d, for instance, it is possible for the measuring/control circuit 40 already once the input current $i_E$ reaches a non-positive threshold value $i_{th}/K$, i.e., the output voltage $u_{A1}$ of the first operational amplifier 45 which serves as a current/voltage converter is non-negative $u_{A1,th}=-i_{E,th}\cdot R=-i_{th}\cdot R=>0$, to switch the gate connection 13 of the first transistor 1 to ground.

In so doing, the positive input of the comparator 47d is controlled by the output voltage $u_{A1}$ of the first operational amplifier 45. The voltage divider of $R_3$ and $R_4$ may control the negative input of the comparator 47d and may thus set, in the form of the voltage $u_{E2}$, the switching threshold of the comparator 47d to the mentioned, non-negative output voltage $u_{A1,th}$ of the first operational amplifier 45, e.g., to $u_{E2}=u_{A1,th}=0.4$ V.

The comparator 47d may be configured such that it generates the output voltage $u_{A2}=u_{R2}$ at its output for $u_{A1}=>u_{E2}$ and thus switches the first transistor 1 on, whereas it generates the output voltage $u_{A2}=-u_{R2}$ (e.g., 0 V) for $u_{A1}<u_{E2}$ and thus switches the first transistor 1 off.

Such a threshold adjustment may also similarly be performed by connecting a suitable reference voltage UR to the reference voltage connection "R" of the operational amplifier 45 in the embodiment of FIG. 1.

The entire circuit 100 may, for instance, be designed as a system-in-a-package with three connection pins "A", "k", and "R", as indicated in FIG. 1. The anode and the cathode of the active diode correspond to the source connection 11 and the drain connection 30 of the first MOSFET transistor 1. The further connection pin "R" may be provided for supplying a gate reference voltage for the measuring/control circuit 40.

Thus, an integrated active diode system in the form of a circuit 100 may be provided in particular embodiments of the invention. This circuit 100 comprises at least one, for instance, n-channel MOSFET transistor as at least one first transistor 1, and at least one second transistor 2. The integrated diode system comprises a first external connection "k" (cathode connection) which is connected with the first connection k of the at least one first transistor 1 and corresponds to a drain connection 30 of the respective MOSFET transistor.

Furthermore, the integrated diode system comprises a second external connection "A" (anode connection) which is connected with the second connection A of the at least one first transistor 1 and corresponds to a source connection 11 of the respective MOSFET transistor. Finally, the integrated diode system comprises a third external connection "R" which is connected with a reference voltage connection for a measuring/control circuit 40 that is in particular designed as an integrated operational amplifier.

Further embodiments of the invention relate to semiconductor structures for implementing active diodes on the basis of current measurement.

In this respect, FIG. 4 shows by way of example a schematic cross-sectional representation of the layer structure of the first transistor 1 and of the second transistor 2 for an active diode in accordance with an embodiment in the form of jointly integrated planar MOSFET transistor structures.

The first connection k of the first transistor 1 and the first connection of the second transistor 2 correspond to the connected drain connections D of the n-channel MOSFET transistor structures formed in the semiconductor in the form of the joint, n+-doped drain layer 30.

The joint drain layer 30 enables an integration of the first transistor 1 and the second transistor 2 on a narrow adjacent space as a basis for a good matching of the transistor parameters of the transistors mentioned so as to enable a mirroring of the first current $i_1$ which is as exact as possible.

With further reference to FIG. 4, the second connection A of the first transistor 1 corresponds to the source connection S11 of the n-channel MOSFET transistor structures at the right in FIG. 4. In analogy, the second connection of the second transistor 2 corresponds to the source connection S21 of the n-channel MOSFET transistor structures at the left in FIG. 4.

The source connection 11 of the first transistor 1 contacts, via narrow horizontal webs of a first wave-like upper conductor path, a series of equidistant n+-doped source regions 11aa, 11ba, etc. of the right MOSFET transistor structures of the first transistor 1. The n+-doped source regions 11aa, 11ba mentioned are each embedded in p-doped wells 11ab, 11bb, etc. Above the n-doped regions between the p-doped wells 11ab, 11bb, etc., there extends a first row of correspondingly likewise equidistant isolated conductor paths 13a, 13b, etc. which together form the gate connection G and thus the control connection 13 of the first transistor 1.

In analogy, the source connection 21 of the second transistor 2 contacts, via further narrow horizontal webs of a second wave-like upper conductor path, a series of equidistant n+-doped source regions 21aa, 21ba, etc. of the left MOSFET transistor structures of the second transistor 2. Also these n+-doped source regions 21aa, 21ba are each embedded in p-doped wells 21ab, 21bb, etc. As already with the first transistor 1, above the n-doped regions between the p-doped wells 21ab, 21bb, etc. there extends a second row of equidistant isolated conductor paths 23a, etc., which together form the gate connection G and thus the control connection 23 of the second transistor 2.

This means that the second connection 11 of the first transistor 1 and the second connection 21 of the second transistor 2 comprise n+-doped regions 11aa, 11ba, etc. or 21aa, 21ba, etc. in p-doped wells 11ab, 11bb, etc. or 21ab, 21bb, etc., and the control connections 13, 23 of the first transistor 1 and the second transistor 2 comprise planar gates 13a, 13b, 13c, etc. or 23a, etc. in whose regions the p-doped wells 11ab, 11bb, etc. or 21ab, 21bb, etc. are separated from each other.

Consequently, FIG. 4 reveals that the first transistor 1 and the second transistor 2 each comprise a plurality of individual transistor cells with spatially separated gates 13a, 13b, 13c, etc. or 23a, etc. and source regions 11aa, 11ba, etc. or 21aa, 21ba, etc.

In particular embodiments based on jointly integrated planar MOSFET transistor structures, the first transistor 1 and the second transistor 2 may correspond to each other in their structure and in their construction.

To enable that in the above-mentioned first state of the active diode, which is also referred to as the operating mode thereof in which a negative first current $i_1$ flows through the first transistor 1 at a negative drain source voltage ($u_{DS}$<0), a negative second current $K \cdot i_1$ is also drawn from the transistor cells of the current-mirroring second transistor 2, the transistor cells of the second transistor 2 ("current mirror cells") may be designed in analogy to the transistor cells of the first transistor 1 ("main cells").

In particular, the transistor cells of the second transistor 2 may, for instance, comprise a plurality of n+-doped source regions 21aa, 21ba, etc. since the current across the pn junctions between the p-wells 21ab, 21bb, etc. and the joint drain connection designed as n+-layer 30 of the first transistor 1 and second transistor 2 may, with a switched-on gate 23, come to a standstill due to a too low voltage drop across the entire second transistor 2.

The integration of these current mirror cells forming the second transistor 2 may, as in the embodiment illustrated in FIG. 4, be performed monolithically with the main cells of the first transistor 1 and is thus as a rule cost-neutral except for the space occupied by the current mirror cells on the joint semiconductor substrate.

Figure 5:
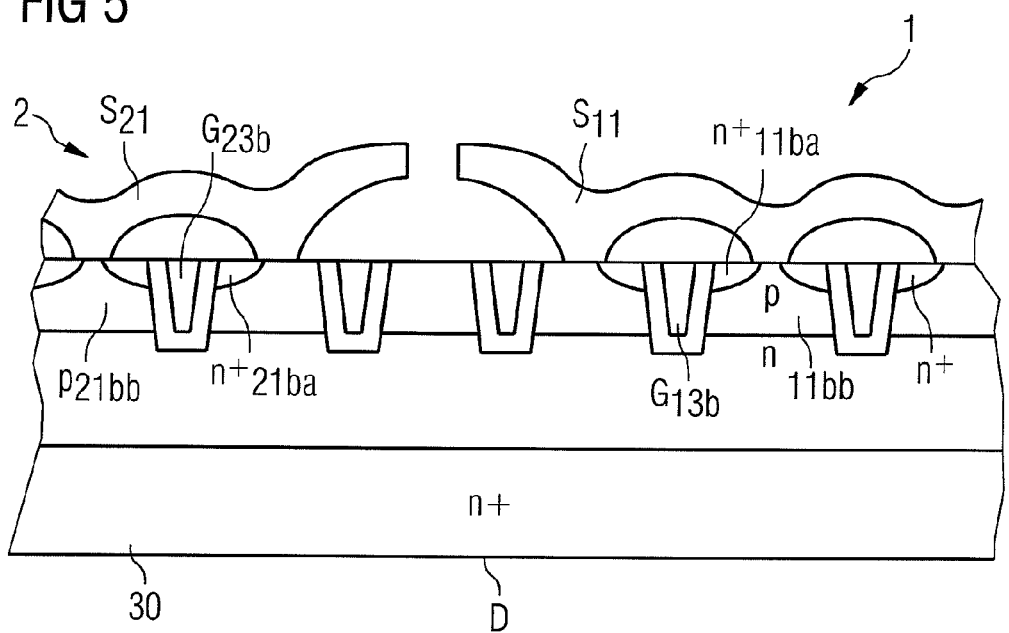
FIG. 5 shows a schematic cross-sectional representation of the layer structure of a main transistor (first transistor) and of a mirror transistor (second transistor) in the form of trench MOSFET transistors for an active diode according to an embodiment.

Pursuant to a further embodiment, FIG. 5 shows a further schematic cross-sectional representation of a further exemplary layer structure of the first transistor 1 and of the second transistor 2 for an active diode in the form of jointly integrated trench MOSFET transistor structures. FIG. 5 also reveals that, in the case of the use of trench MOSFET transistors, the first transistor 1 and the second transistor 2 may each comprise a plurality of individual transistor cells with spatially separated gates and source regions.

Also in particular embodiments based on jointly integrated trench MOSFET transistor structures, the first transistor 1 and the second transistor 2 may correspond to each other in their structure and in their construction.

As already indicated, the above-mentioned circuits for active diodes or the above-mentioned diode system may be used in any of the initially mentioned rectifiers. Such rectifiers are suited very well for systems for voltage conversion and/or regulation due to their high degree of integration, their easy exchangeability, their high switching rate, and/or their high insensitiveness to interferences.

In accordance with another embodiment, the invention relates further to a method for operating an active diode. In particular embodiments, the method mentioned is in particular suited to increase the insensitiveness to interferences and/or the switching rate of an active diode in the form of at least one transistor.

In one embodiment, the method comprises the following steps:

In one step, a current $i_1$ is determined by means of at least one measuring/control circuit which is defined as positive from a first connection k to a second connection A of the transistor, and which is controllable by this transistor. In a further step, the transistor is controlled such by the measuring/control circuit that the transistor is switched on for currents $i_1$ under and at most up to a predetermined, non-positive threshold value ($i_1 <= i_{th} <= 0$), and is otherwise switched off.

In a further embodiment, the determining of the current $i_1$ comprises the following steps:

In one step, the current $i_1$ as a first current is mirrored in a second current $K \cdot i_1$ by means of at least one second transistor. In a further step, the second current $K \cdot i_1$ is measured by means of the measuring/control circuit.

In this further embodiment, the controlling of the first transistor comprises the following steps:

In one step, a control signal pertaining to the second current $K \cdot i_1$ is generated by means of the measuring/control circuit. In a further step, control connections of the first and of the second transistor are controlled by the control signal such that the first transistor is switched on for first currents $i_1$ under and at most up to a predetermined, non-positive threshold value ($i_1 <= i_{th} <= 0$), and is otherwise switched off.

In a particular embodiment of the method, an n-channel MOSFET transistor is chosen as a first transistor, for which $i_1 = i_{DS} = -i_{Ak}$ and K>0 applies. In this embodiment of the method, the generating of the control signal comprises the following steps:

If a negative or at most negligible second current $K \cdot i_{DS} <= 0$ is measured, a switch-on control signal $u_{GS} > u_{th}$ is generated for the first transistor.

If, however, a positive second current $K \cdot i_{DS} > 0$ is determined, a switch-off control signal $u_{GS} = 0$ is generated for the first transistor.

In a further particular embodiment of the method, an n-channel MOSFET transistor is also chosen as a first transistor, for which $i_1 = i_{DS} = -i_{Ak}$ and K>0 applies. In this embodiment of the method, the generating of the control signal comprises the following steps:

If a negative second current or a second current that at most reaches a non-positive threshold value $K \cdot i_{DS} <= i_{th} <= 0$ is measured, a switch-on control signal $u_{GS} > u_{th}$ is generated for the first transistor.

If, however, a second current exceeding the negative threshold value $K \cdot i_{DS} > i_{th}$ is determined, a switch-off control signal $u_{GS} = 0$ is generated for the first transistor.

What is claimed is:

1. A circuit comprising:
   at least one transistor, wherein a current that flows from a first connection to a second connection of the transistor can be controlled;
   at least one first measuring/control circuit for determining the current and causing the at least one transistor to be switched on when the current is below and at most up to a predetermined, non-positive threshold value, and otherwise to be switched off when the current is above the predetermined, non-positive threshold value, wherein the at least one first measuring/control circuit comprises
   a current input coupled to the at least one transistor, and
   an amplifier having an amplifier input, an amplifier output, and a resistance coupled between the amplifier input and the amplifier output, the amplifier output producing an output signal that is inverted with respect to the amplifier input; and
   a second measuring/control circuit parallel to the at least one first measuring/control circuit, the second measuring/control circuit comprising a second amplifier to amplify at least a portion of the current input into the at least one first measuring/control circuit, the second amplifier connected to a gate of a shutdown device for switching off the at least one transistor faster than the at least one first measuring/control circuit in case of an emergency if the current is a positive current of an opposite polarity of the non-positive threshold value.

2. The circuit according to claim 1, wherein:
the at least one transistor comprises a first transistor and the current comprises a first current;
the circuit further comprises at least one second transistor for mirroring the first current in a second current; and
wherein the at least one first measuring/control circuit measures the second current and generates a control signal, wherein control connections of the at least one transistor and the second transistor can be controlled by the control signal such that the at least one transistor and the at least one second transistor are switched on when the current is below and at most up to a predetermined, non-positive threshold value, and otherwise to be switched off.

3. The circuit according to claim 2, wherein the at least one transistor, the at least one second transistor and the at least one first measuring/control circuit are monolithically integrated on a single substrate.

4. The circuit according to claim 2, wherein the at least one transistor and the at least one second transistor comprise transistors selected from the group consisting of n-channel MOSFET transistors, planar MOSFET transistors, trench MOSFET transistors, field-plate trench MOSFET transistors, superjunction transistors, p-channel MOSFET transistors, bipolar transistors and Insulated Gate Bipolar Transistors (IGBTs).

5. The circuit according to claim 3, wherein the at least one transistor and the at least one second transistor each comprise a plurality of individual transistor cells with spatially separated gates and source regions.

6. The circuit according to claim 3, wherein the at least one transistor and the at least one second transistor correspond to each other in their structures.

7. The circuit according to claim 3, wherein the first connection of the at least one transistor and a first connection of the at least one second transistor comprise a joint drain region.

8. The circuit according to claim 3, wherein the second connection of the at least one transistor and a second connection of the at least one second transistor comprise n+-doped regions in p-doped wells, and wherein the control connections of the at least one transistor and the at least one second transistor comprise planar or vertical gates in whose regions the p-doped wells are separated from each other.

9. The circuit according to claim 3, wherein the at least one first measuring/control circuit comprises at least one operational amplifier.

10. The circuit according to claim 3, wherein the at least one first measuring/control circuit comprises at least one driver-compatible p-channel MOSFET transistor for controlling the control connection of the at least one transistor.

11. The circuit according to claim 10, wherein the circuit comprises a rectifier comprising at least one active diode.

12. An integrated active diode system comprising:
at least one MOSFET transistor wherein a current flows between a source connection and a drain connection of the at least one MOSFET transistor;
a first external connection that is coupled to the drain connection of the at least one MOSFET transistor;
a second external connection that is coupled to the source connection of the at least one MOSFET transistor;
a first measuring/control circuit for determining the current and causing the at least one MOSFET transistor to be switched on when the current is below and at most up to a predetermined, non-positive threshold value, and otherwise to be switched off, wherein the first measuring/control circuit comprises
a current input coupled to the at least one MOSFET transistor, and
an amplifier having a first amplifier input, a second amplifier input, an amplifier output, and a resistance coupled between the first amplifier input and the amplifier output, the amplifier output producing an output signal that is inverted with respect to the first amplifier input;
a second measuring/control circuit parallel to the first measuring/control circuit, the second measuring/control circuit comprising a second amplifier to amplify at least a portion of the current input into the first measuring/control circuit, the second amplifier connected to a gate of a shutdown MOSFET for switching off the at least one MOSFET transistor faster than the first measuring/control circuit in case of an emergency if the current is a positive current of an opposite polarity of the non-positive threshold value; and
a third external connection that is coupled to the second amplifier input of the first measuring/control circuit.

13. The integrated active diode system according to claim 12, wherein the integrated active diode system comprises a rectifier.

14. A system for voltage conversion and/or regulation with at least one rectifier according to claim 13.

15. A method for operating an active diode in the form of at least one transistor, the method comprising:
determining a first current defined as positive from a first connection to a second connection of a transistor, determining comprising
mirroring the first current in a second current with a second transistor;
measuring the second current with a first circuit comprising an inverting amplifier having an input coupled to a current measurement input and a resistance coupled between an output of the inverting amplifier and the input of the inverting amplifier;
controlling the transistor, controlling comprising
switching on the transistor when the current is below and at most up to a predetermined non-positive threshold value,
switching-off the transistor when the current is above the predetermined non-positive threshold value, and
generating a control signal related to the second current; and
shutting-off the transistor at a turn-off rate that is faster than the step of switching-off the transistor if the first current is a positive current of an opposite polarity of the non-positive threshold value, shutting-off the transistor comprising using a second circuit comprising a second amplifier having an output coupled to a gate of a shutdown MOSFET to amplify at least a portion of the first current to produce an amplified signal, and switching off the transistor using the amplified signal.

16. The method according to claim 15, wherein the current is determined and the transistor is controlled by a measuring/control circuit.

17. The method according to claim 15, wherein controlling of the transistor comprises:
generating a control signal related to the second current; and controlling control connections of the transistor and the second transistor with the control signal such that the transistor is switched on when the current is below and at most up to a predetermined, non-positive threshold value, and is otherwise switched off.

18. The method according to claim 17, wherein determining the first current, controlling the transistor, measuring the second current, and controlling the control connections are all performed by a measuring/control circuit.

19. The method according to claim 17, wherein the transistor comprises an n-channel MOSFET transistor, wherein generating of the control signal comprises:
for $K \cdot i_{DS} \leq 0$, generating a switch-on control signal $u_{GS} > u_{th}$ for the transistor;
for $K \cdot i_{DS} > 0$: generating a switch-off control signal $u_{GS} = 0$ for the transistor;
wherein $i_{DS}$ is the current, K is a mirror ratio, $u_{GS}$ is the control signal and $u_{th}$ is a threshold voltage.

20. The method according to claim 17, wherein the transistor comprise an n-channel MOSFET transistor and wherein the generating of the control signal comprises:
for $K \cdot i_{DS} \leq i_{th} \leq 0$, generating a switch-on control signal $u_{GS} > u_{th}$ for the transistor;
for $0 > i_{th} < K \cdot i_{DS}$: generating a switch-off control signal $u_{GS} = 0$ for the transistor;
wherein $i_{DS}$ is the current, K is a mirror ratio, $u_{GS}$ is the control signal and $i_{th}$ is a threshold current of the transistor.

21. The method according to claim 17, wherein generating the control signal comprises generating the control signal from the inverting amplifier.

22. The method according to claim 17, wherein generating the control signal comprises generating the control signal from a control signal generation circuit coupled to the inverting amplifier.

23. The circuit according to claim 1, further comprising at least one further transistor coupled between the at least one transistor and the current input of the at least one first measuring/control circuit.

24. A circuit comprising:
at least one transistor, wherein a current that flows from a first connection to a second connection of the at least one transistor can be controlled;
a first measuring/control circuit for determining the current and causing the at least one transistor to be switched on when the current is below and at most up to a predetermined non-positive threshold value, and to be switched off when the current is above the predetermined, non-positive threshold value; and
a second measuring/control circuit parallel to the first measuring/control circuit, the second measuring/control circuit comprising a second amplifier to amplify at least a portion of the current input into the first measuring/control circuit, the second amplifier connected to a gate of a shutdown MOSFET for switching off the at least one transistor faster than the first measuring/control circuit in case of an emergency if the current is a positive current of an opposite polarity of the non-positive threshold value.

25. The circuit according to claim 24, wherein the shutdown MOSFET comprises a PMOS device.

26. The circuit according to claim 1, wherein the shutdown device comprises a PMOS device.

27. The integrated active diode system according to claim 12, wherein the shutdown MOSFET comprises a PMOS device.

28. The circuit according to claim 1, wherein the shutdown device comprises a high ampacity or low gate resistance MOSFET.

29. The circuit of claim 1, wherein the shutdown device comprises a high ampacity or low gate resistance MOSFET.

30. The method according to claim 15, wherein the shutdown MOSFET comprises a high ampacity or low gate resistance MOSFET.

31. The circuit according to claim 24, wherein the shutdown MOSFET comprises a high ampacity or low gate resistance MOSFET.

* * * * *